(12) United States Patent
Heinrichsdorff et al.

(10) Patent No.: US 7,880,269 B2
(45) Date of Patent: Feb. 1, 2011

(54) INTEGRATED CIRCUIT INCLUDING A CAPACITOR AND METHOD

(75) Inventors: Frank Heinrichsdorff, Mahlow (DE); Steffen Meyer, Dresden (DE); Jens Schmidt, Berlin (DE)

(73) Assignee: Qimonda AG, Munich (DE)

( * ) Notice: Subject to any disclaimer, the term of this patent is extended or adjusted under 35 U.S.C. 154(b) by 291 days.

(21) Appl. No.: 12/056,625

(22) Filed: Mar. 27, 2008

(65) Prior Publication Data
US 2009/0242952 A1  Oct. 1, 2009

(51) Int. Cl.
*H01L 29/00* (2006.01)
(52) U.S. Cl. ............... 257/532; 257/296; 257/E29.343; 438/238; 438/396; 438/957
(58) Field of Classification Search ................ 257/296, 257/532, E29.343; 438/238, 396, 957
See application file for complete search history.

(56) References Cited

U.S. PATENT DOCUMENTS

| 7,102,204 | B2 | 9/2006 | Berndlmaier et al. |
| 7,235,838 | B2 | 6/2007 | Lin et al. |
| 7,248,495 | B2 | 7/2007 | Arimoto et al. |
| 7,638,385 | B2 * | 12/2009 | Grivna et al. ............... 438/208 |
| 2006/0003522 | A1 * | 1/2006 | Lin et al. .................... 438/238 |

* cited by examiner

*Primary Examiner*—Andy Huynh
(74) *Attorney, Agent, or Firm*—Dicke, Billig & Czaja, PLLC

(57) ABSTRACT

An integrated circuit including a capacitor and a method of fabricating an integrated circuit. The capacitor has a first electrode. A plurality of conductive lines is separated from each other and is configured to be held at a potential being the same for all conductive lines. A second electrode encloses individual ones of the conductive lines at a top side and at least one lateral side and is separated from the first electrode by a dielectric layer. The second electrode includes a polycrystalline semiconductor material, a metal or a metal-semiconductor compound.

9 Claims, 12 Drawing Sheets

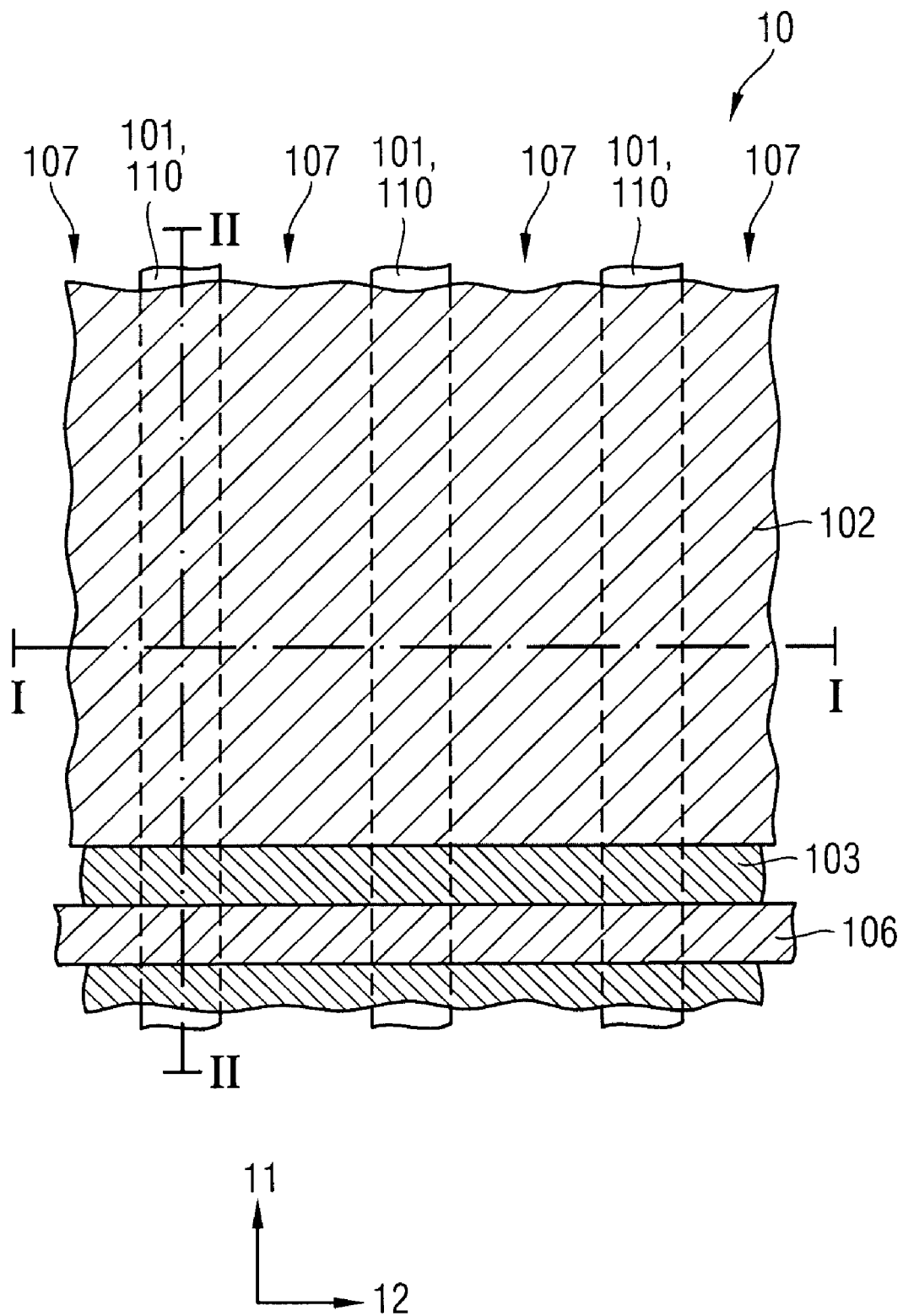

INTEGRATED CIRCUIT INCLUDING A CAPACITOR AND METHOD

BACKGROUND

Semiconductor devices, such as integrated circuits, may include capacitors having a first and a second electrode and a dielectric layer arranged between the first and the second electrode. The capacity of the capacitors depends on the dielectric properties and the thickness of the dielectric layer and on the area of the electrodes. Capacitors may be formed, for instance, as planar devices at least partially above a substrate surface.

Planar capacitors consume a large area of a substrate surface causing high costs. Furthermore, a method of fabricating a planar capacitor may include a planarization process to form a planar surface of an insulating material enclosing the capacitor. A chemical-mechanical polishing process (CMP) may cause dishing of material for large areas, thus the available area of individual capacitors and their capacity is limited.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2A illustrates a plan view on one embodiment of the integrated circuit.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
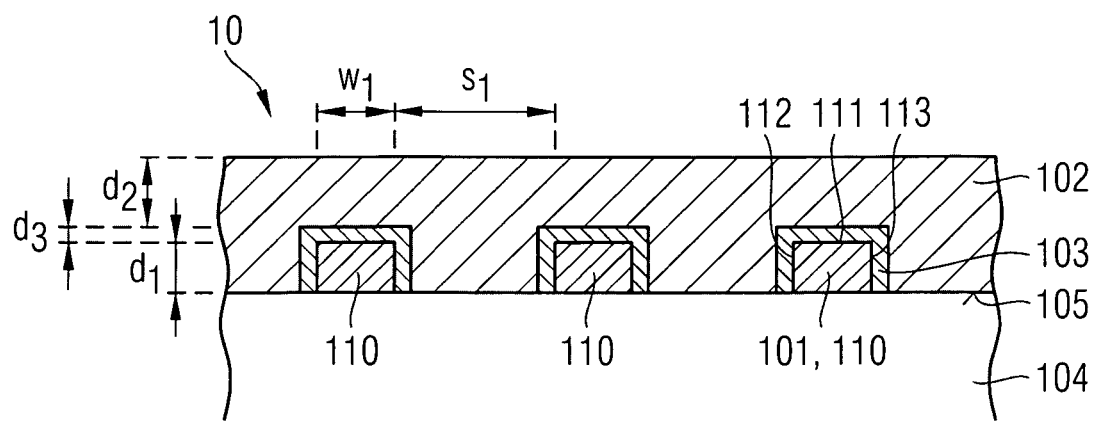
FIGS. 1A and 1B illustrate cross-sectional views of embodiments of the integrated circuit.

FIG. 1A illustrates a cross-sectional view of one embodiment of an integrated circuit including a capacitor 10. The capacitor 10 includes a first capacitor electrode 101, a second capacitor electrode 102 and a capacitor dielectric layer 103. The first capacitor electrode 101 includes a plurality of conductive lines 110, which are separated from each other by a distance s1 and are configured to be held at a potential being the same for all conductive lines 110. In FIG. 1A three conductive lines 110 forming the first capacitor electrode 101 are illustrated. Nevertheless, the first capacitor electrode 101 may include another number of conductive lines, for instance, two or more than three. The distances 1 between two neighboring conductive lines 110 may for instance be 1F, wherein F denotes the minimum lithographic feature size obtainable with a specific used technology.

Figure 1B:
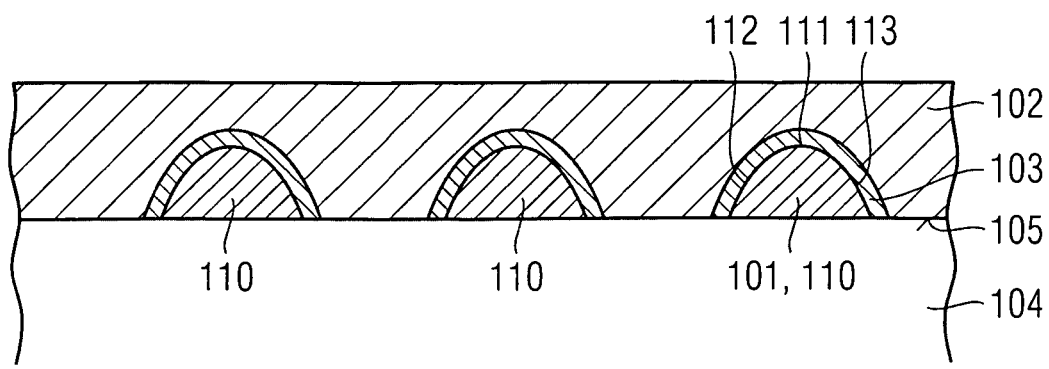

The conductive lines 110 extend into a first direction and may have any shape in a cross-section taken in a direction perpendicular to the first direction. The conductive lines 110 may have a rectangular cross-sectional shape including a top side 111 and two lateral sides 112 and 113, as illustrated in FIG. 1A. Nevertheless, the conductive lines 110 may have, for instance, a triangular shape or a shape with curved sides. As is clearly to be understood, it is not necessary that the top side 111 and the two lateral sides 112, 113 are implemented as straight planes intersecting at a defined angle. The top side 111 and the two lateral sides 112, 113 can as well be implemented as curved surfaces, as is illustrated in FIG. 1B. In this case, the term "top side" refers to the upper portion of an individual one of the conductive lines 110, whereas the term "lateral side" refers to the lateral portion of the conductive line 110.

The conductive lines 110 of the first capacitor electrode 101 may have a thickness d1 measured from the top side 111. The thickness d1 may be larger than or equal to 5 nm. The thickness d1 may be smaller than or equal to 500 nm. The thickness d1 may be defined according to a width of the conductive lines 110 and may be in the range of 0.1 to 10 times the width of the conductive lines 110.

The second electrode 102 encloses the conductive lines 110 of the first electrode 101 at the top side 111 and at least one of the lateral sides 112, 113. The second electrode 102 may be formed as a thick layer having an essentially planar upper surface above the first electrode 101, as it is illustrated in FIG. 1A. Nevertheless, the second electrode 102 may be formed as a conformal layer enclosing individual ones of the conductive lines 110 at the top side 111 and at least one lateral side 112 or 113. The second capacitor electrode 102 may have a thickness d2 measured from an upper surface of the second capacitor electrode 102 to an upper surface of the dielectric layer 103 on the top side 111 of the conductive lines 110. The thickness d2 may be larger than or equal to 5 nm. The thickness d2 may be smaller than or equal to 600 nm.

The dielectric layer 103 is arranged in between the first and the second electrode 101, 102. Since the lateral sides 112, 113 of the conductive lines 110 are used as an effective interface area, the capacitor area may be increased compared to a capacitor including two planar electrodes. If the conductive lines 110 have a rectangular shape, as illustrated in FIG. 1A, and have a width w1 measured at the top side 111, and if the second electrode 102 is arranged at both lateral sides 112, 113, the ratio of the effective interface area AA compared to a planar interface area may be calculated by the following formula (1):

$$\Delta A = (w1 + 2d1)/(w1 + s1) \quad (1)$$

The dielectric layer 103 may be formed as a conformal layer on the top side 111 and the lateral sides 112, 113 of the conductive lines 110. The dielectric layer 103 may have a thickness d3. The thickness d3 may be larger than or equal to 1 nm. The thickness d3 may be smaller than or equal to 40 nm. The dielectric layer 103 can be made of any suitable dielectric material. Examples of the capacitor dielectric material include a high-k dielectric having a dielectric constant larger than 3.9. For example, $HfO_x$, HfSiO (hafniumsilicate), $ZrO_x$, $Al_xO_y$, HfAlO, TaO and any multilayer system including any of these layers may be taken. The capacitor dielectric material may include silicon oxide, silicon nitride or silicon oxynitrides or layer stacks including these materials. Furthermore, the capacitor dielectric need not be silicon based. It may include oxides or nitrides of other semiconductor materials as well.

The first and the second capacitor electrodes 101, 102 may, for example, be made of a conductive material such as a metal, a noble metal or a metal alloy. Examples of the conductive material include W, Ti, TiN, TaN, TaSiN, Ru, WN and HfN. The materials of the first and second capacitor electrodes can be identical or different from each other. Furthermore, the capacitor electrodes may include a semiconductor material, wherein the second capacitor electrode 102 may include a polycrystalline semiconductor material, such as polysilicon. The first capacitor electrode may as well include a monocrystalline semiconductor material, as for instance a semiconductor bulk substrate. The first and the second electrode 101, 102 may include a layer stack of different conductive materials.

As illustrated in FIG. 1A, the conductive lines 110 may be formed above a surface 105 of a substrate or carrier 104. The conductive lines 110 may be formed directly on the substrate surface 105, as illustrated in FIG. 1A, if the substrate surface 105 is formed such, that the conductive lines 110 of the first capacitor electrode 101 and the second electrode 102 are electrically insulated from each other. Nevertheless, an intermediate layer, for instance an insulating layer, may be formed between the substrate surface 105 and a lower side of the conductive lines 110.

The term "substrate" used in the following description may include any type of carrier, like a carrier made of a conductive or an insulating material or a semiconductor substrate. The term "semiconductor substrate" includes any semiconductor-based structure that has a semiconductor surface. Semiconductor structure is to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide.

FIG. 2A illustrates a plan view on an embodiment of an integrated circuit including a capacitor 10. The capacitor 10 includes a plurality of conductive lines 110 forming the first capacitor electrode 101 and extending into a first direction 11. The conductive lines 110 are separated from each other by trenches 107. A second capacitor electrode 102 is formed as a plate above the conductive lines 110. The first and the second capacitor electrodes 101, 102 are separated from each other by a capacitor dielectric layer 103. A contact line 106 extends into a second direction 12 intersecting the first direction 11 and is electrically coupled to the conductive lines 110. The contact line 106 may be formed at the same plane as the second electrode 102 and is electrically insulated from the second electrode 102.

Figure 2B:
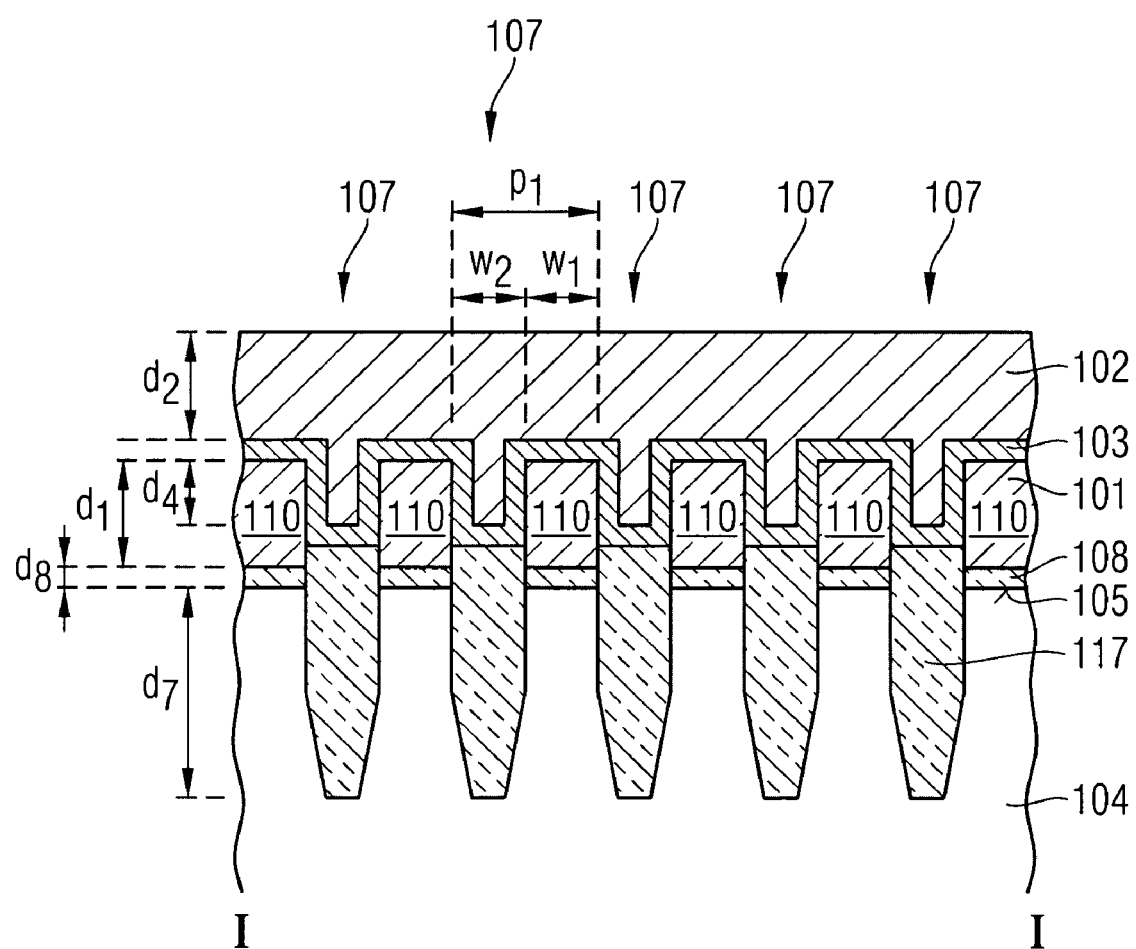
FIGS. 2B and 2C illustrate cross-sectional views of the embodiment of FIG. 2A.

FIG. 2B illustrates a cross-sectional view taken along line I-I of FIG. 2A, that is intersecting a plurality of the conductive lines 110 in a region, where the second electrode 102 is formed. The conductive lines 110 are formed of a conductive material above a surface 105 of a substrate 104. The conductive lines 110 are separated from the substrate surface 105 by an insulating layer 108. The conductive lines 110 have a line width w1, which is measured at the substrate surface 105 and may be essentially the same over the whole thickness of the conductive lines 110. The width w1 may be larger than or equal to 1 nm. The width w1 may be smaller than or equal to 100 nm. Individual ones of the conductive lines 110 are separated from each other by the trenches 107 extending into the substrate 104 to a depth d7 measured from the substrate surface 105. The depth d7 may be larger than or equal to 0 nm. The depth d7 may be smaller than or equal to 2 μm. The trenches 107 have a trench width w2 measured in between two neighboring conductive lines 110 at the substrate surface 105. The width w2 may be larger than or equal to 1 nm. The width w2 may be smaller than or equal to 100 nm. The width w2 may be used instead of the distance s1 in formula (1). A pitch p1 of the conductive lines 110 is given by p1=w1+w2, wherein w1 may be equal to w2.

The trenches 107 are filled with an insulating material 117, such as silicon oxide or silicon nitride. The insulating material 117 may extend above the substrate surface 105 and even above an upper surface of the insulating layer 108. The insulating layer 108 may have a thickness d8. The thickness d8 may be larger than or equal to 1 nm. The thickness d8 may be smaller than or equal to 40 nm. The insulating layer 108 may be formed of any suitable insulating material, for instance of silicon oxide, silicon nitride or high-k dielectric materials as described above.

The dielectric layer 103 is formed conformal on exposed surfaces of the conductive lines 110 and the upper surface of the insulating material 117 within the trenches 107. A second capacitor electrode 102 is formed of a conductive material on top of the dielectric layer 103 thus enclosing the conductive lines 110 at a top side and two lateral sides. The second capacitor electrode 102 extends to a depth d4 in the spaces between the conductive lines 110. The depth d4 is measured from the top side 111 of the conductive line 110 and may be smaller than, equal to or larger than the thickness d1 of the conductive lines 110. If d4 is smaller than d1, d4 is used in formula (1) instead of d1.

Figure 2C:
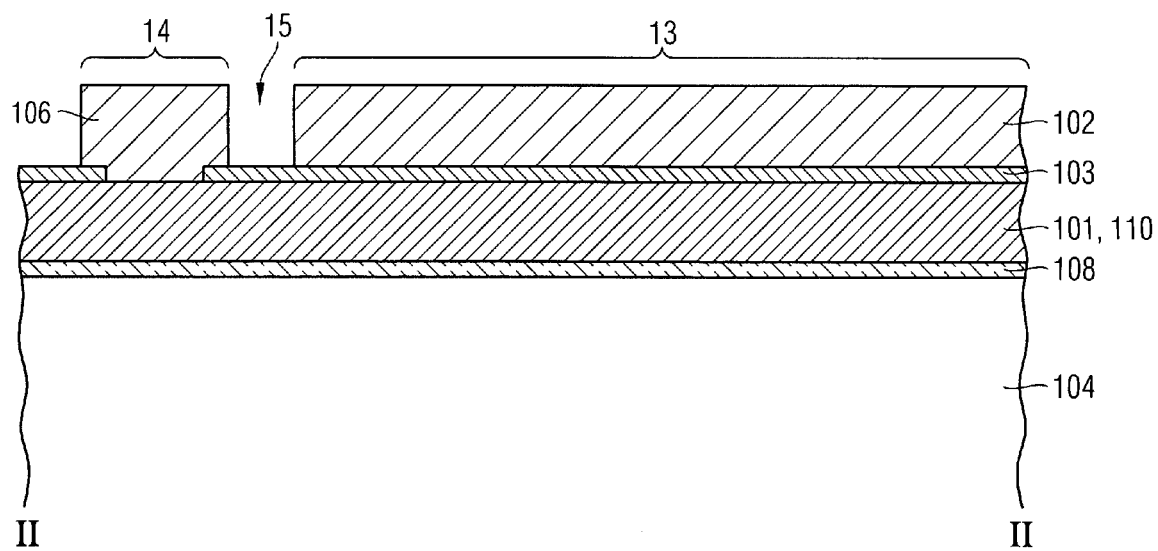

FIG. 2C illustrates a cross-sectional view taken along line II-II of FIG. 2A, that is along one conductive line 110. In a capacitor region 13, the second capacitor electrode 102 is formed above and enclosing the conductive line 110. The dielectric layer 103 is formed between the first and the second capacitor electrodes 101, 102. In a contact region 14, the contact line 106 is formed which is electrically coupled to the conductive line 110. The dielectric layer 103 may be removed from a portion of the contact region 14 such, that the contact line 106 is in direct contact to the conductive line 110, as illustrated in FIG. 2C. The contact line 106 is separated from the second capacitor electrode 102 by a space 15, which may be filled with an insulating material. The contact line 106 may be formed of any conductive material as described with respect to the first and second capacitor electrodes 101, 102. In an embodiment, the contact line 106 may be formed of the same material as the second electrode 102.

Figure 3A:
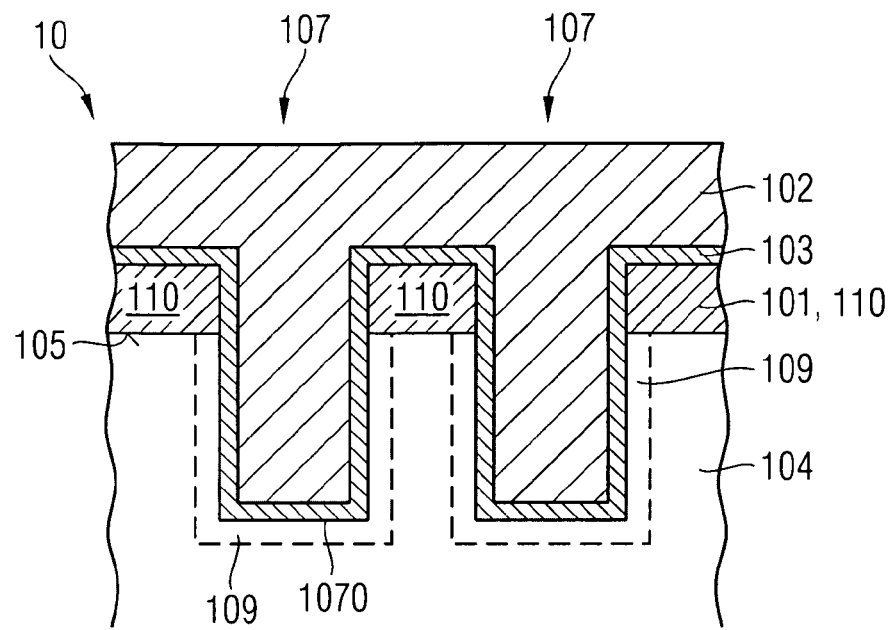
FIGS. 3A to 3C illustrate cross-sectional views of embodiments of the integrated circuit.

Other embodiments of a capacitor 10 will be described with respect to FIGS. 3A to 3C. FIG. 3A illustrates a cross-sectional view intersecting different conductive lines 110 of a first capacitor electrode 101. The conductive lines 110 are formed directly on a surface 105 of a semiconductor substrate 104. The conductive lines 110 are separated from each other by trenches 107 extending into the substrate 104. Doped substrate portions 109 are formed along trench surfaces 1070 within the substrate 104. The substrate portions 109 may be formed, for instance, by a doping process after forming the trenches 107. The substrate portions 109 may serve as a contact line connecting the individual conductive lines 110 and may form a part of the first capacitor electrode 101. A dielectric layer 103 is formed conformal on the conductive lines 110 and on the trench surfaces 1070. A second capacitor electrode 102 is formed on the dielectric layer 103. The second electrode 102 encloses the conductive lines 110 and fills the trenches 107.

Figure 3B:
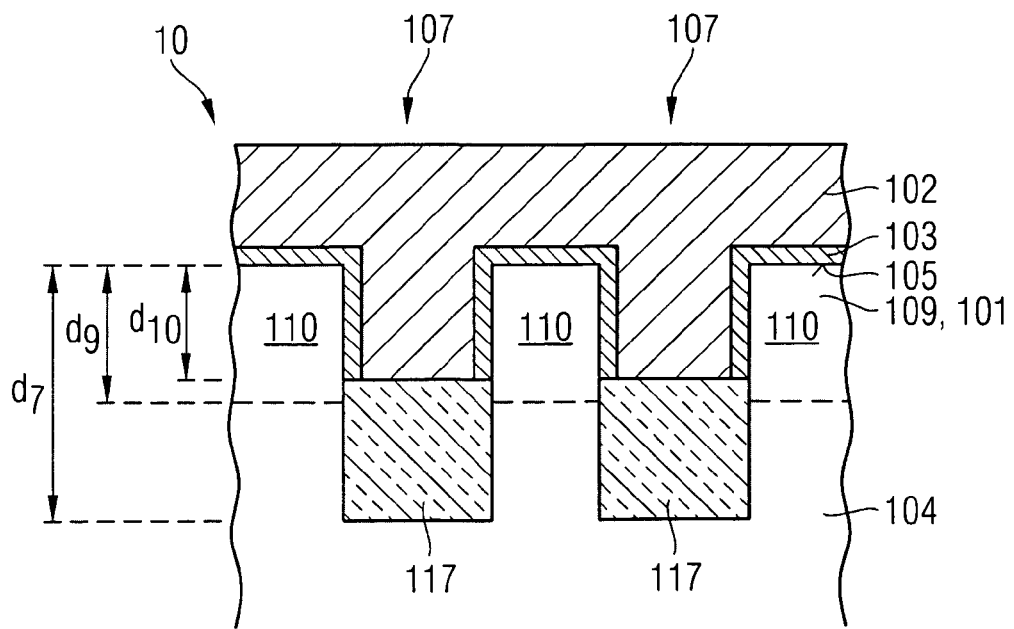

FIG. 3B illustrates one embodiment of a capacitor 10 in a cross-sectional view intersecting different conductive lines 110 of a first capacitor electrode 101. The conductive lines 110 are formed as doped substrate portions 109 within a semiconductor substrate 104. The substrate portions 109 extend to a depth d9 measured from a substrate surface 105, wherein d9 corresponds to the depth d1 in formula (1). The conductive lines 110 are separated from each other by trenches 107 extending into the substrate 104 to a depth d7 larger than the depth d9. The substrate portions 109 may be formed, for instance, by a doping process before forming the trenches 107. The trenches 107 may be filled with an insulating material 117 which may extend from a bottom portion of the trenches 107 to a depth d10 smaller than the depth d9, wherein the depth d10 is measured from the substrate surface 105. A dielectric layer 103 may be formed on the conductive lines 110 leaving a portion of the insulating material 117 uncovered. Nevertheless, the dielectric layer 103 may be formed conformal on the conductive lines 110 and on an upper surface of the insulating material 117. A second capacitor electrode 102 is formed on the dielectric layer 103. The second electrode 102 encloses the conductive lines 110 and fills the spaces between the conductive lines 110.

Figure 3C:
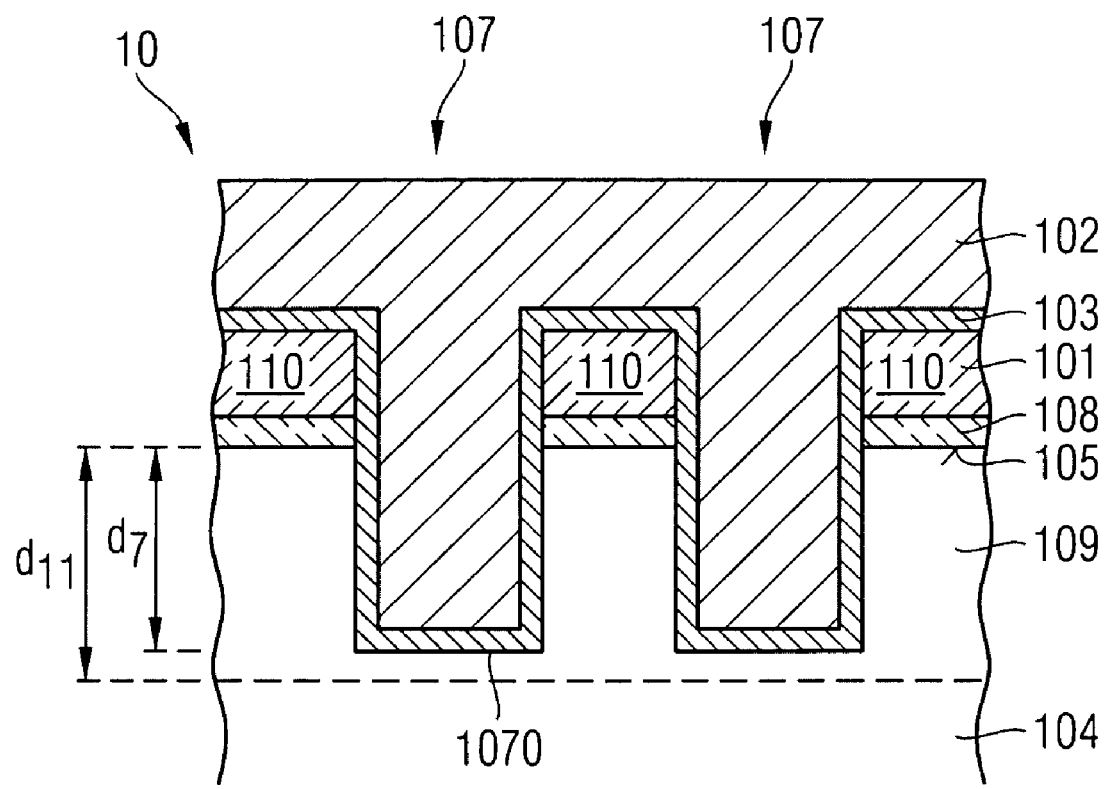

FIG. 3C illustrates one embodiment of a capacitor 10 in a cross-sectional view intersecting different conductive lines 110 of a first capacitor electrode 101. The conductive lines 110 are formed above a surface 105 of a semiconductor substrate 104 and are insulated from the semiconductor substrate 104 by an insulating layer 108. The conductive lines 110 are separated from each other by trenches 107 extending into the substrate 104 to a depth d7 measured from the substrate surface 105. An upper portion 109 of the semiconductor substrate 104 is formed as a highly conductive portion. The substrate portion 109 may be formed, for instance, by a doping process before forming the trenches 107. The substrate portion 109 may extend to a depth d11 larger than the depth d7, wherein the depth d11 is measured from the substrate surface 105. A dielectric layer 103 is formed conformal on the conductive lines 110 and on trench surfaces 1070. The dielectric layer 103 may be formed of the same material and with the same thickness as the insulating layer 108. A second capacitor electrode 102 is formed on the dielectric layer 103.

The second electrode 102 encloses the conductive lines 110 and fills the trenches 107. Nevertheless, the trenches 107 may be filled with an insulating material extending to the substrate surface 105 such, that the second electrode 102 only fills the spaces between the conductive lines 110. The second capacitor electrode 102 may be electrically coupled to the substrate portion 109 such that the second capacitor electrode 102 and the substrate portion 109 are configured to be held at the same potential. In another embodiment, the first capacitor electrode 101 may be electrically coupled to the substrate portion 109 such that the first capacitor electrode 101 and the substrate portion 109 are configured to be held at the same potential.

Figure 4A:
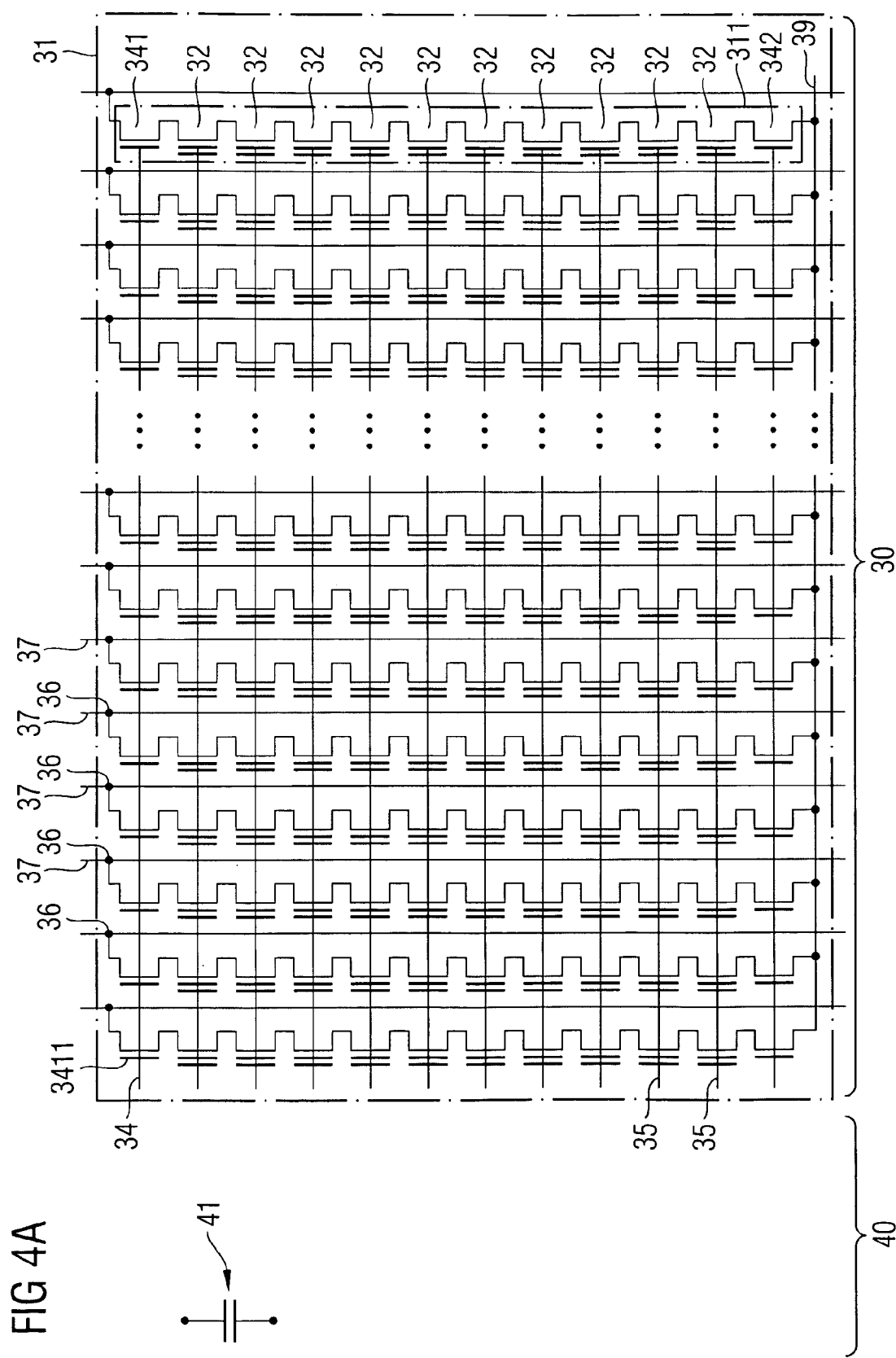
FIG. 4A illustrates an equivalent circuit diagram of one embodiment of a memory device.

FIG. 4A illustrates one example equivalent circuit diagram of one embodiment of an integrated circuit including a memory array region 30 and a peripheral region 40. In the memory array region 30, a memory device including NAND-strings 311 is formed. A plurality of NAND-strings 311 forms a block 31. Each NAND-string 311 includes a first select transistor 341, a plurality of storage transistors 32, and a second select transistor 342. A plurality of bit lines 37 as well as a plurality of word lines 35 are formed so as to perpendicularly intersect each other. The NAND-strings 311 may be formed so as to extend parallel with respect to the direction of the bit lines 37. A common source line 39 is coupled to the source portions of each of the second select transistors 342. Furthermore, the drain portions of each of the first select transistors 341 are coupled to a corresponding bit line 37 via a bit line contact structure 36. The first select transistors 341 are controlled by a first select gate line 34. The first select gate line 34 is coupled to the first select gates 3411 of the first select transistors 341, respectively.

In the peripheral region 40, a capacitor 41 is arranged. Furthermore, devices for controlling read and write operations of the memory cells may be formed in the peripheral region 40.

Figure 4B:
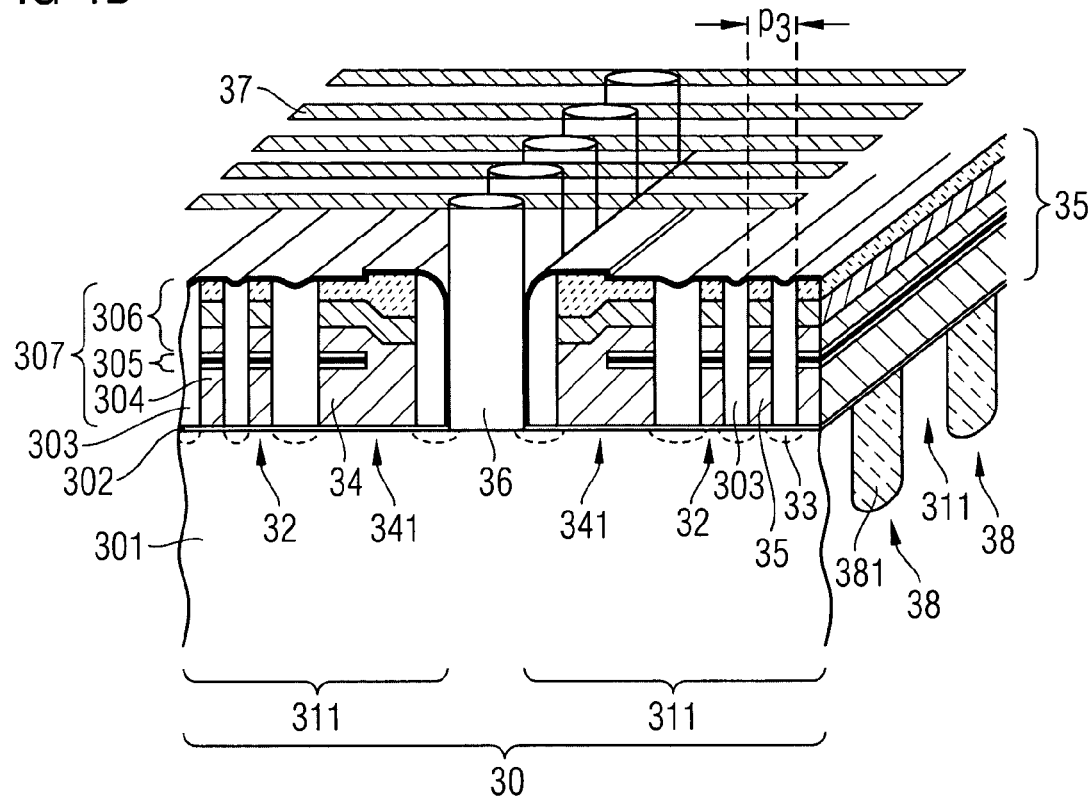
FIG. 4B illustrates a perspective view on a memory array region of one embodiment of the memory device of FIG. 4A.

FIG. 4B illustrates schematically a perspective view of the memory array region 30 of one example embodiment of the memory device of FIG. 4A. The memory device includes a plurality of memory cells 32, which may be implemented as storage transistors 32 in the illustrated embodiment, and a plurality of conductive lines 35, 37. Each of the storage transistors 32 includes doped regions 33 formed within a substrate 301. A channel region is formed between each of the doped regions 33. The conductivity of an individual one of the channel regions is controlled via a corresponding gate electrode. The gate electrode includes a gate stack 307. In the illustrated embodiment, the gate stack 307 may include a charge storing layer 304 which may be made of a conductive material, such as polysilicon. The charge storing layer 304 is insulated from the substrate 301 by a gate insulator 302, for instance silicon oxide. A control gate 306 is provided above the charge storing layer 304. The control gate 306 may include a layer stack formed of different conductive materials, such as polysilicon and metals, and is insulated from the charge storing layer 304 by a barrier layer stack 305 which may include a silicon oxide layer, followed by a silicon nitride layer, followed by a silicon oxide layer.

A plurality of storage transistors 32 are coupled in series, thereby forming a NAND-string 311. A selected NAND-string 311 may be addressed by addressing a common source line (not illustrated), activating a corresponding first select transistor 341 and a corresponding second select transistor (not illustrated) and reading the signal via a bit line contact structure 36, which is electrically coupled to a bit line 37. The select transistor 341 may be addressed by the first select gate line 34. The gate electrodes of individual storage transistors 32 of a NAND-string 311 are separated from each other by spaces filled with an insulating material 303.

Gate electrodes of the storage transistors 32, which are arranged in a row perpendicular to the cross-sectional plane of FIG. 4B may be connected to each other, thereby forming word lines 35. The gate electrodes of the storage transistors 32 of a NAND-string 311, and thus the word lines 35, are arranged with a pitch p3, which is the sum of a width of one gate electrode and a width of a space between two neighboring gate electrodes, wherein the widths are measured at the substrate surface.

Individual NAND-strings 311 are separated from each other by isolation trenches 38 formed within the substrate 301 and extending in a direction parallel to the individual NAND-strings 311. The isolation trenches 38 are filled with an insulating material 381, such as silicon oxide or silicon nitride.

Although an electrical coupling of the storage transistors forming a NAND architecture is illustrated in FIGS. 4A and 4B, the storage transistors of the memory device may be coupled in another way, forming, for instance a NOR architecture.

Figure 4C:
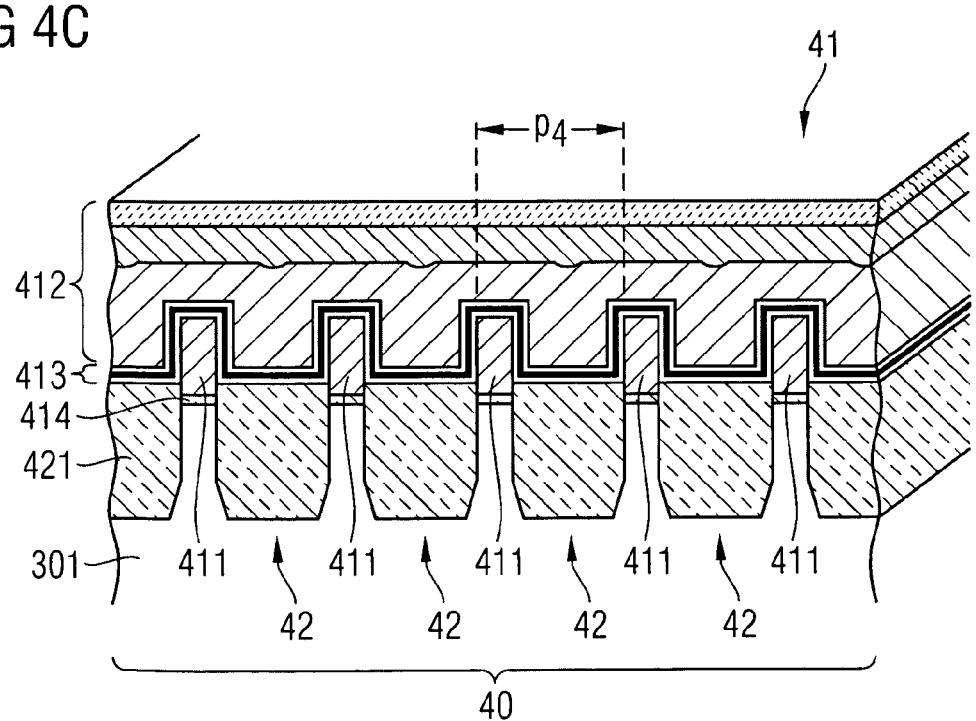
FIG. 4C illustrates a perspective view on a peripheral region of one embodiment of the memory device of FIG. 4A.

FIG. 4C illustrates schematically a perspective view of the capacitor 41 in the peripheral region 40 of one example embodiment of the memory device of FIG. 4B. A plurality of conductive lines 411 forming the first capacitor electrode are formed above the substrate 301 being the same as in the memory array region 30. The conductive lines 411 may be made of the same material and with the same thickness as the charge storing layer 304. The conductive lines 411 are separated from each other by isolation trenches 42 extending into the substrate 301. The isolation trenches 42 may extend into the substrate 301 to the same depth as the isolation trenches 38. The isolation trenches 42 are filled with an insulating material 421, which may extend above a surface of the substrate 301. The insulating material 421 may be the same material as the insulating material 381. The conductive lines 411 are insulated from the substrate 301 by an insulating layer 414, which may be made of the same material and with the same thickness as the gate insulator 302. A capacitor dielectric 413 is formed conformal on the conductive lines 411 and on top of the insulating material 421 such that it encloses the conductive lines 411 on a top side and on two lateral sides. The capacitor dielectric 413 may be a layer stack including the same layers as the barrier layer stack 305. A second capacitor electrode 412 is formed on top of the capacitor dielectric 413. The second capacitor electrode may be a layer stack including the same layers as the control gate stack 306.

The term "same layers" is to be understood in that way, that corresponding layers of two layer stacks compared with each other are formed of the same material and with the same thickness and are arranged in the same layer sequence in both layer stacks.

The conductive lines 411 are arranged with a pitch p4, which is the sum of a width of one conductive line 411 and a width of a space between two neighboring conductive lines 411, wherein the widths are measured at the substrate surface. The pitch p4 may be equal to a multiple of the pitch p3 of the gate electrodes in the memory array region 30. The pitch p4 may be equal to the pitch p3.

Figure 5A:
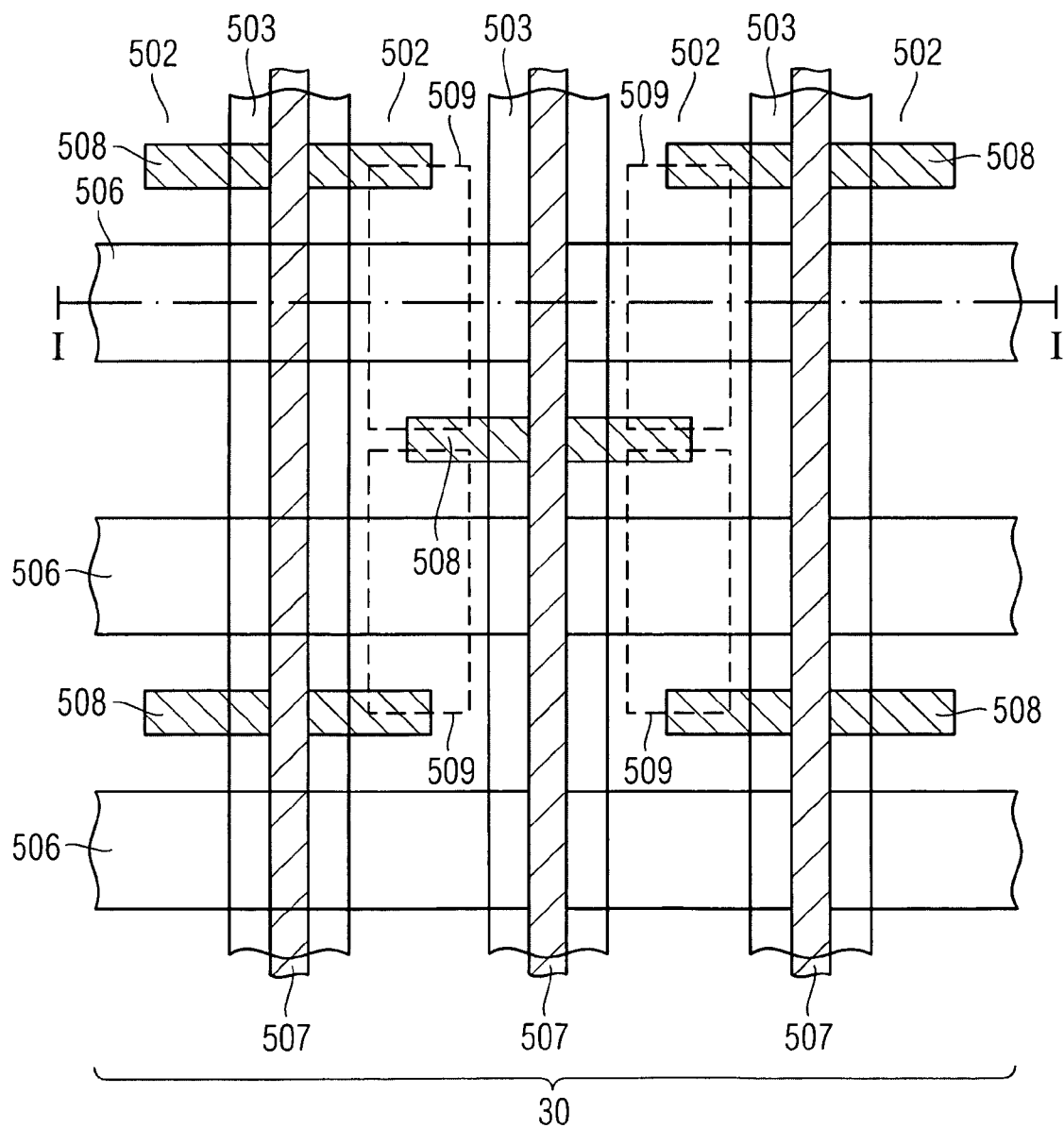
FIG. 5A illustrates a plan view of one embodiment of a memory device.

FIG. 5A illustrates a plan view on one embodiment of an integrated circuit including a memory array region 30 and a peripheral region (not illustrated in FIG. 5A). In the peripheral region a capacitor may be formed as described with respect to FIG. 4A. In the memory array region 30, a memory device may be formed including memory cells 509, which are implemented as storage transistors 509 and are arranged in a virtual ground NOR architecture. Such a memory array includes a plurality of active area lines 502 which extend into a first direction. The active area lines 502 are separated from each other by isolation trenches 503. Within an individual one of the active area lines 502 source/drain regions of an individual one of the storage transistors 509 are formed. The source/drain regions are separated from each other by a channel region within the active area line 502. A gate electrode is formed by a word line 506 extending in a second direction intersecting the first direction. A storage layer stack is disposed between the channel region and the gate electrode. The storage layer stack usually includes a charge trapping layer, which may, for example, be a silicon nitride layer. A lower boundary layer may be disposed beneath the charge trapping layer. An upper boundary layer may be disposed above the charge trapping layer. The upper and lower boundary layers sandwich the charge trapping layer. The upper and lower boundary layers have a thickness larger than 2 nm to avoid any direct tunnelling. The charge stored in the charge storing layer controls a threshold voltage of the storage transistor 509. The source and the drain region of one individual storage transistor 509 are electrically coupled to two neighboring bit lines 507 via bit line contacts 508. The bit lines 507 extend above the isolation trenches 503 in the first direction.

Figure 5B:
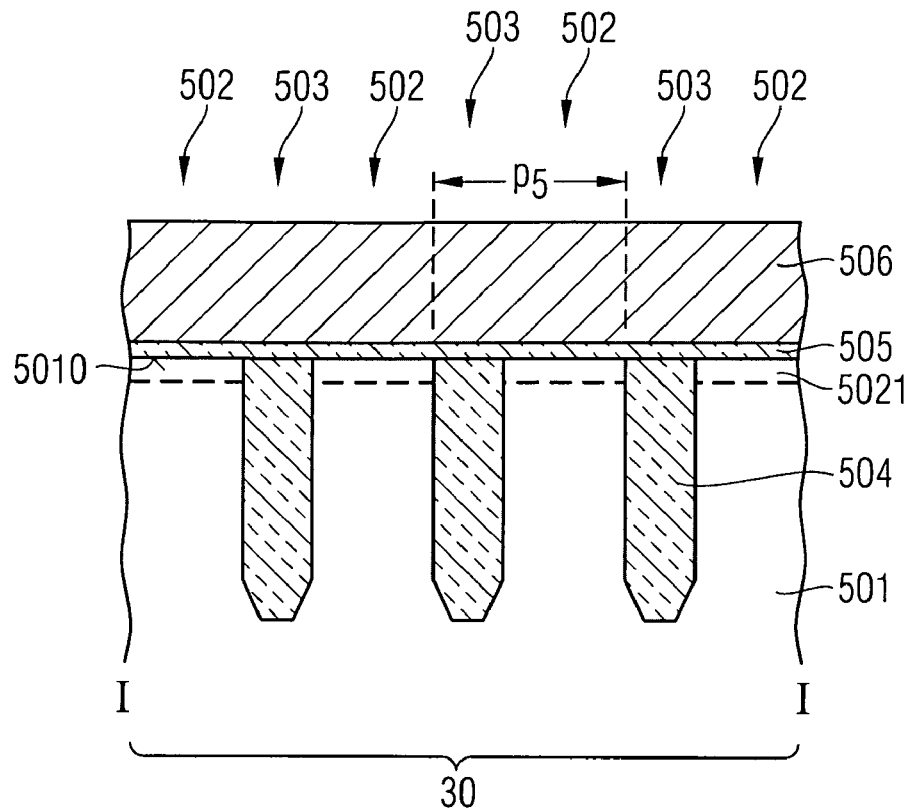
FIGS. 5B and 5C illustrate cross-sectional views of the embodiment of FIG. 5A.

FIG. 5B illustrates a cross-sectional view of the memory array region 30 illustrated in FIG. 5A along line I-I, that is along one word line 506. Active area lines 502 are formed within a semiconductor substrate 501. In the illustrated cross-sectional plane, channel regions 5021 are arranged in the active area lines 502 adjacent to an upper surface 5010 of the substrate 501. The active area lines 502 include source/drain regions formed as doped portions adjacent to the substrate surface 5010 in cross-sectional planes before and behind the illustrated cross-sectional plane. The active area lines 502 are separated by isolation trenches 503 extending into the substrate 501 deeper than the source/drain regions. The isolation trenches 503 are filled with an insulating material 504, such as silicon oxide, extending to the substrate surface 5010. A storage layer stack 505 is formed on the active area lines 502 and the insulating material 504. A word line 506 serving as the gate electrodes of individual memory cells 509 is formed on the storage layer stack 505. The word line 506 may include a layer stack of different conductive layers, as for instance a polysilicon layer and a metal layer. Bit lines (not illustrated) are formed above the word line 506 in regions above the isolation trenches 503 and extend in the direction of the isolation trenches 503.

The active area lines 502 have a pitch p5, which is the sum of a width of one active area line 502 and of a width of one isolation trench 503, the widths measured at the substrate surface 5010.

Figure 5C:
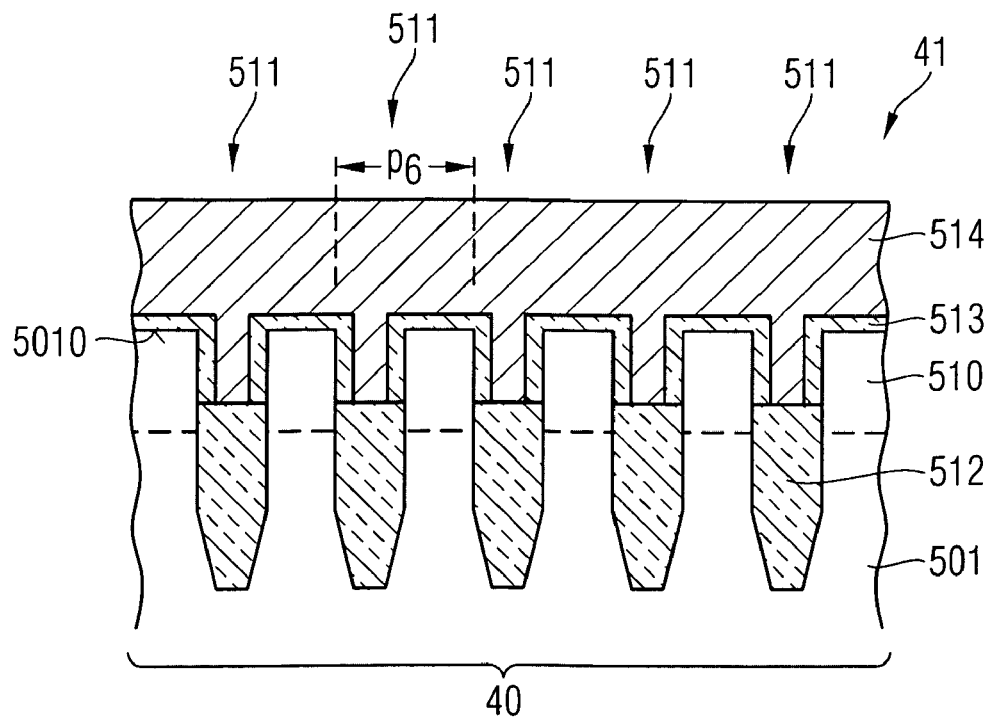

FIG. 5C illustrates a cross-sectional view of a capacitor 41 formed in a peripheral region 40 of the memory device of FIG. 5B. In the substrate 501 being the same as in the memory array region 30, conductive lines 510 are formed as doped portions of the substrate 501 adjacent to the substrate surface 5010. The conductive lines 510 may extend into the substrate 501 to the same depth as the source/drain regions of the memory cells 509. The conductive lines 510 form a first capacitor electrode and are separated from each other by isolation trenches 511. The isolation trenches 511 may extend into the substrate 501 to the same depth as the isolation trenches 503 in the memory array region 30. The isolation trenches 511 extend deeper than the conductive lines 510 into the substrate 501 and are filled with an insulating material 512. The insulating material 512 may be the same as the insulating material 504 in the memory array region 30. The insulating material 512 extends from a bottom portion of the trenches 511 to a depth smaller than the depth of the conductive lines 510 and do not extend to the substrate surface 5010. A capacitor dielectric 513 is formed conformal on the conductive lines 510 such that it encloses the conductive lines 510 on a top side and on two lateral sides and extends to an upper surface of the insulating material 512 leaving a portion of the insulating material 512 uncovered. Nevertheless, the capacitor dielectric 513 may be formed on the whole surface of the insulating material 512 as well. The capacitor dielectric 513 may include the same layers as the storage layer stack 505 of the memory cells 509. A second capacitor electrode 514 is formed on the capacitor dielectric 513 and fills the spaces between the conductive lines 510. The second capacitor electrode 514 may include the same layers as the word line 506 in the memory array region 30.

The conductive lines 510 are arranged with a pitch p6, which is the sum of a width of one conductive line 510 and a width of a space between two neighboring conductive lines 510, wherein the widths are measured at the substrate surface 5010. The pitch p6 may be equal to a multiple of the pitch p5 of the active area lines 502 in the memory array region 30. The pitch p6 may be equal to the pitch p5.

In one embodiment, the integrated circuit may include other memory cells and a plurality of conductive lines in the memory array region. The conductive lines in the memory array region may include the material of the conductive lines of the first capacitor electrode of the capacitor formed in the peripheral region. Furthermore, the integrated circuit may include a plurality of second conductive lines in the memory array region, wherein the second conductive lines may include the material of the second capacitor electrode.

Figure 6:
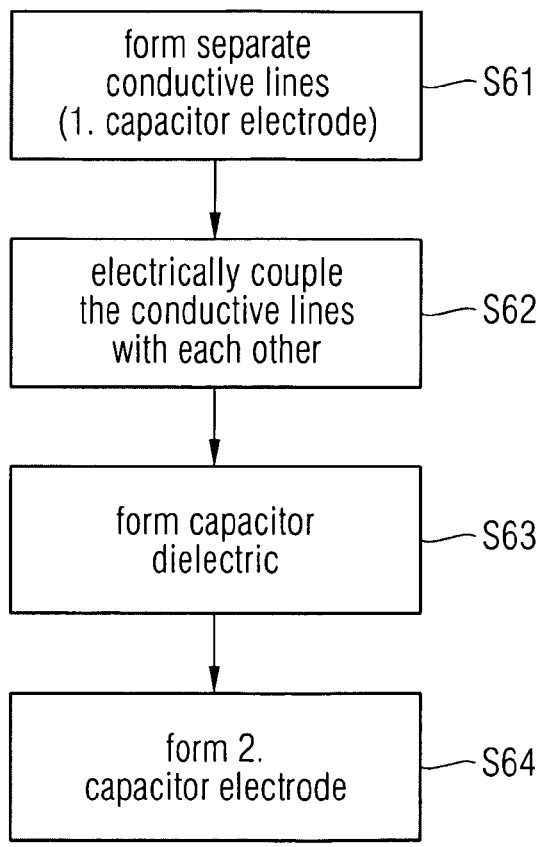
FIG. 6 illustrates a flow diagram of one embodiment of a method for fabricating the integrated circuit.

FIG. 6 illustrates a flow diagram of one embodiment of a method of manufacturing an integrated circuit including a capacitor. A first conductive layer is patterned to form separate conductive lines (S61). The first conductive layer may be formed above a substrate or may be an upper portion of a semiconductor substrate, wherein the upper portion is highly doped. The first conductive layer includes a conductive material or may be a layer stack of different conductive materials, such as semiconductor material, metals, metal-semiconductor compounds, conductive carbides or nitrides. The first conductive layer may be patterned by an etching process using an etching mask, as for example a patterned resist layer system or a patterned hard mask layer. Trenches or spaces are formed between individual conductive lines by the patterning process, wherein the trenches or spaces reach through the first conductive layer and separate the individual conductive lines. The trenches may reach into a layer or substrate underlying the first conductive layer. The trenches may be filled with an insulating material, wherein the insulating material extends only to a height such that spaces are left between the individual conductive lines. Nevertheless, no insulating material at all may be formed within the spaces or trenches.

The conductive lines are electrically coupled with each other such that all conductive lines are configured to be held at the same potential (S62). This may be achieved, for example, by connecting the individual conductive lines by a contact line of a conductive material, as it is illustrated in FIGS. 2A and 2C, or by a highly-doped substrate portion, as it is illustrated in FIG. 3A. By connecting the conductive lines, a first capacitor electrode may be formed.

Since the first capacitor electrode includes separate conductive lines which are separated by spaces or filled trenches, a planarization process, for instance for removing excess insulating material which is filled into the trenches or spaces between the individual conductive lines, may be improved. For instance, a dishing effect which may occur in large lateral regions including a conductive material may be avoided. Thus, limitations of the capacity by the maximal lateral area of the first capacitor electrode may be reduced.

A capacitor dielectric layer may be formed on exposed surfaces of the conductive lines (S63). The exposed surfaces may be top sides of the conductive lines and at least one lateral side of individual ones of the conductive lines, wherein the lateral side may be exposed only partially. The capacitor dielectric layer may be formed conformal and may be formed on all exposed surfaces, that is also on surfaces of the trenches or on surfaces of an insulating material formed within the trenches. The capacitor dielectric layer may be a layer stack of dielectric materials as described above.

A second conductive material is formed on the capacitor dielectric layer such that it encloses individual ones of the conductive lines at the top side and at least one lateral side (S64). The second conductive material forms the second capacitor electrode. It may be formed as a conformal layer on the capacitor dielectric layer or may be formed as a layer above the conductive lines, filling the spaces between the conductive lines and having an essentially planar upper surface.

In one embodiment, the capacitor dielectric layer is removed from a section of individual ones of the first conductive lines. The second conductive material is patterned such that it forms the second capacitor electrode in sections of the first conductive lines where the capacitor dielectric layer is not removed and that it forms a contact to at least one conductive line in the section where the capacitor dielectric layer is removed.

Figure 7:
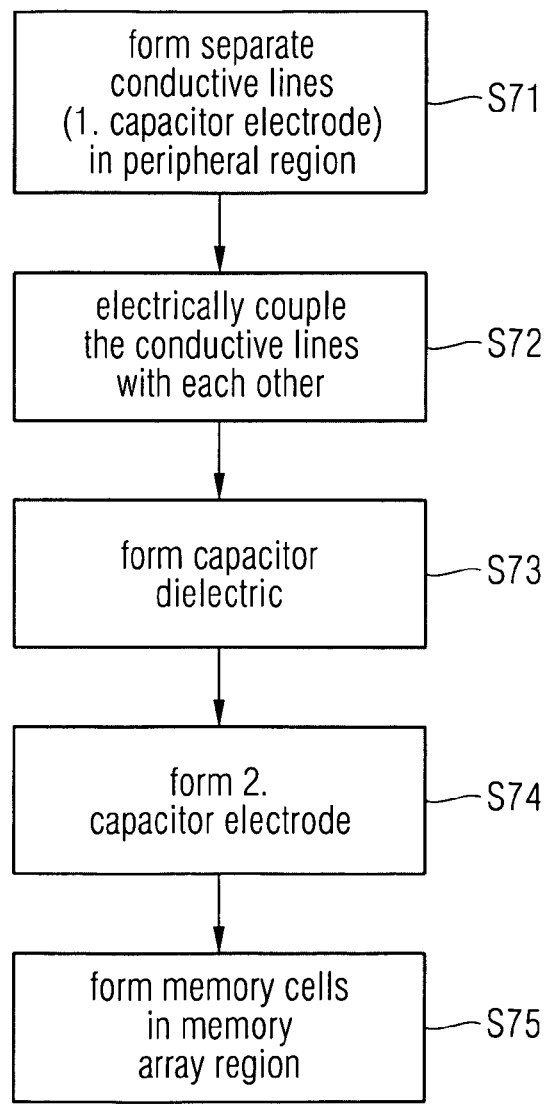
FIG. 7 illustrates a flow diagram of one embodiment of a method for fabricating the memory device.

FIG. 7 illustrates a flow diagram of one embodiment of a method of manufacturing an integrated circuit including memory cells in a memory array region and a capacitor in a peripheral region. The method includes forming memory cells within the memory array region (S75) and processes for manufacturing the capacitor (S71 to S74), wherein S71 to S74 correspond to S61 to S64, respectively, as described with respect to FIG. 6. Some processes may be shared by both forming the memory cells and forming the capacitor. Furthermore, S71 to S75 may be performed in other sequences than that illustrated in FIG. 7.

In one embodiment, forming the memory cells includes forming a transistor including a gate stack, wherein the gate stack includes the first conductive layer. Thus, patterning the first conductive layer to form conductive lines of the capacitor and to form gate electrodes of individual transistors may be performed in a common processing step.

In one embodiment, forming the gate stack of the memory cells includes forming the capacitor dielectric layer on top of the first conductive layer in the memory array region and forming the second conductive material on the capacitor dielectric layer in the memory array region. The first conductive layer, the dielectric layer and the second conductive layer, respectively, may be formed simultaneously in the peripheral and the memory array regions. The second conductive layer may be patterned in the memory array region to form individual gate electrodes or individual conductive lines. Furthermore, the dielectric layer may be removed in portions of the memory array region and of the peripheral region by a common process to form select transistors in the memory array region and to form a contact to at least one conductive line in the peripheral region. FIGS. 4B and 4C illustrate resulting structures of this embodiment.

In one embodiment, forming memory cells includes forming isolation trenches in the memory array region by an etching process. By the same etching process trenches may be formed in the peripheral region to pattern the first conductive layer and to form separate conductive lines in the peripheral region.

In one embodiment, the method further includes forming conductive lines in the memory array region, wherein the conductive lines in the memory array region include the material of the second capacitor electrode. The second conductive material may be formed simultaneously in both the memory array region and the peripheral region to form the conductive lines in the memory array region and the second capacitor electrode in the peripheral region. An example of the resulting structure is illustrated in FIGS. 5B and 5C. Nevertheless, the material of the conductive lines in the memory array region and of the second capacitor electrode may be different and only a patterning process, for example an etching process, to form the conductive lines in the memory array region and the second capacitor electrode in the peripheral region may be performed by a common processing step.

Figure 8:
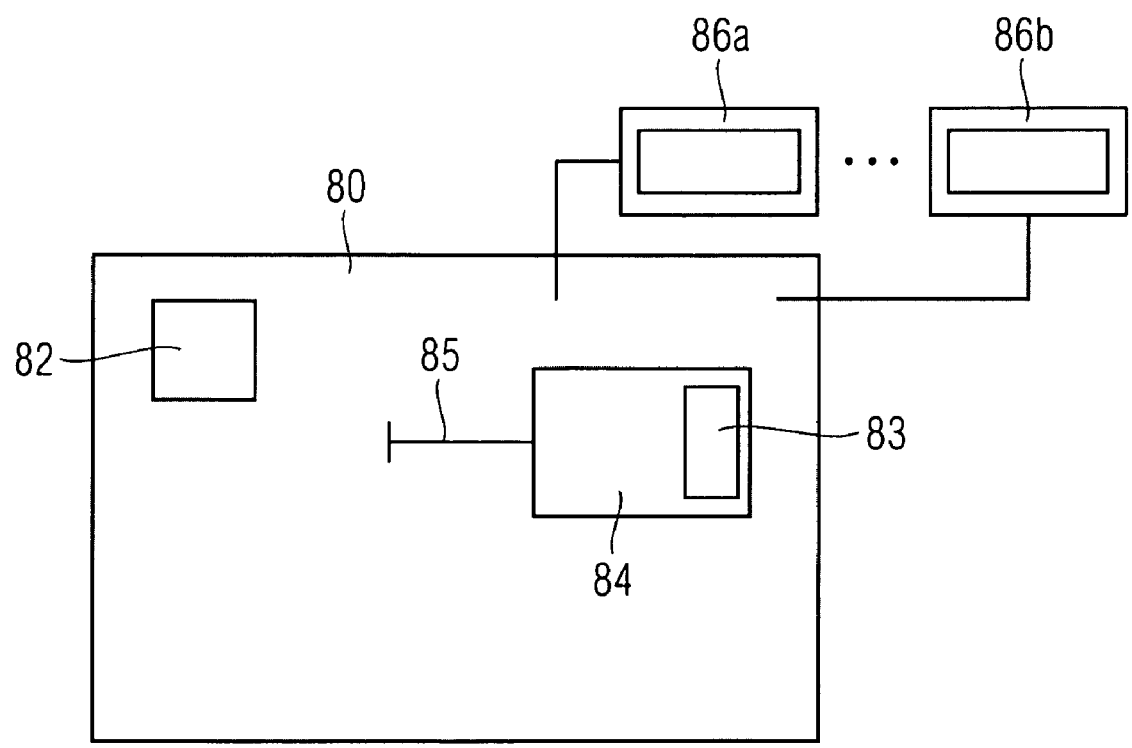
FIG. 8 illustrates a schematic view of one embodiment of a system including the integrated circuit.

FIG. 8 schematically illustrates a system 80 according to one embodiment. As is illustrated in FIG. 8, the system 80 may include an interface 85 and a component 84 which is adapted to be interfaced by the interface 85. The system 80, for example the component 84, may include an integrated circuit 83 including a capacitor or a memory device as has been explained above. The component 84 may be connected in an arbitrary manner with the interface 85. For example, the component 84 may be externally placed and may be connected with the system 80 by the interface 85. Moreover, the component 84 may be housed inside the system 80 and may be connected with the interface 85. By way of example, it is also possible that the component 84 is removably mounted in a slot which is connected with the interface 85. When the component 84 is inserted into the slot, the integrated circuit 83 is interfaced by the interface 85. The system 80 may further include a processing device 82 for processing data. In addition, the system 80 may further include one or more display devices 86a, 86b for displaying data. The system may further include components which are configured to implement a specific electronic system. Examples of the electronic system include a computer, for example, a personal computer, or a notebook, a server, a router, a game console, for example, a video game console, as a further example, a portable video game console, a graphics card, a personal digital assistant, a digital camera, a cell phone, an audio system such as any kind of music player, a video system or a PC-card. The component 84 may be a system for storing data, like for instance a USB stick or a solid state hard disk. For example, the system 80 may be a portable electronic device.

The embodiments of the invention described in the foregoing are examples given by way of illustration and the invention is nowise limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a capacitor comprising:
    a first electrode comprising a plurality of conductive lines separated from each other and being configured to be held at a potential being the same for all conductive lines; and
    a second electrode enclosing individual ones of the conductive lines at a top side and at least one lateral side and being separated from the first electrode by a dielectric layer, the second electrode comprising a polycrystalline semiconductor material, a metal or a metal-semiconductor compound; and
    a contact line extending across the plurality of conductive lines, the contact line electrically coupled to the plurality of conductive lines of the first electrode and electrically insulated from the second electrode.

2. The integrated circuit of claim 1, comprising wherein the conductive lines of the first electrode are formed above a surface of a substrate.

3. The integrated circuit of claim 2, comprising wherein the conductive lines are separated from each other by trenches extending into the substrate and being partially filled with an insulating material.

4. The integrated circuit of claim 2, comprising wherein the substrate is a semiconductor substrate and wherein the first electrode comprises doped substrate portions.

5. The integrated circuit of claim 1, wherein the dielectric layer comprises a material or a layer stack of materials selected from a group comprising semiconductor oxides, semiconductor nitrides, or high-k dielectrics.

6. The integrated circuit of claim 1, comprising:
    wherein the conductive lines of the first electrode comprise polysilicon, are formed above a semiconductor substrate and are separated from the semiconductor substrate by a gate oxide layer;
    the conductive lines are separated from each other by trenches extending into the semiconductor substrate and being filled with an insulating material extending above a surface of the substrate, a trench width of individual ones of the trenches being equal to a line width of individual ones of the conductive lines;
    the dielectric layer is formed conformal on the top and the lateral sides of the conductive lines and on top of the insulating material within the trenches and comprises a layer stack of a first silicon oxide layer, a silicon nitride layer and a second silicon oxide layer; and
    the second electrode is formed above and in the trenches between the conductive lines of the first electrode and comprises polysilicon.

7. A method of manufacturing an integrated circuit including a capacitor comprising:
    patterning a first conductive layer to form separate conductive lines;
    electrically connecting the conductive lines to form a first electrode of the capacitor;
    forming a second electrode of the capacitor in a second conductive material;
    forming a dielectric layer between the first and the second electrode of the capacitor;
    forming the dielectric layer on a top side and on lateral sides of the conductive lines;
    forming the second conductive material above and in the spaces between the conductive lines;
    removing the dielectric layer from a section of the first conductive layer; and patterning the second conductive material to form the second electrode of the capacitor and to form a contact to the first conductive layer.

8. The method of claim 7, comprising forming the first conductive layer above a surface of a substrate.

9. The method of claim 8, wherein patterning the first conductive layer comprises etching trenches reaching through the first conductive layer into the substrate.

* * * * *